United States Patent
Birner et al.

(10) Patent No.: US 11,581,418 B2
(45) Date of Patent: Feb. 14, 2023

(54) SELECTIVE THERMAL ANNEALING METHOD

(71) Applicant: Infineon Technologies AG, Neubiberg (DE)

(72) Inventors: Albert Birner, Regensburg (DE); Rudolf Berger, Regensburg (DE); Helmut Brech, Lappersdorf (DE); Olaf Storbeck, Dresden (DE); Haifeng Sun, Regensburg (DE); John Twynam, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/894,223

(22) Filed: Jun. 5, 2020

(65) Prior Publication Data
US 2021/0384318 A1    Dec. 9, 2021

(51) Int. Cl.
| | |
|---|---|
| *H01L 29/66* | (2006.01) |
| *H01L 21/02* | (2006.01) |
| *H01L 21/265* | (2006.01) |
| *H01L 21/268* | (2006.01) |
| *H01L 23/29* | (2006.01) |

(Continued)

(52) U.S. Cl.
CPC .... *H01L 29/66462* (2013.01); *H01L 21/0217* (2013.01); *H01L 21/268* (2013.01);
(Continued)

(58) Field of Classification Search
None
See application file for complete search history.

(56) References Cited

U.S. PATENT DOCUMENTS

| | | |
|---|---|---|
| 9,601,352 B2 | 3/2017 | Ouerghi et al. |
| 2007/0155102 A1 | 7/2007 | Goldbach et al. |
| 2011/0092057 A1 | 4/2011 | Suvorov |

FOREIGN PATENT DOCUMENTS

EP    1791173 A1    5/2007

OTHER PUBLICATIONS

Muth, J. F. "Absorption coefficient, energy gap, exciton binding energy, and recombination lifetime of GaN obtained from transmission measurements" Appl. Phys. Lett. 71 (18) Nov. 1997 pp. 2572-2574 (Year: 1997).*

(Continued)

*Primary Examiner* — Grant S Withers
(74) *Attorney, Agent, or Firm* — Murphy, Bilak & Homiller, PLLC

(57) ABSTRACT

A semiconductor body having a base carrier portion and a type III-nitride semiconductor portion is provided. The type III-nitride semiconductor portion includes a heterojunction and two-dimensional charge carrier gas. One or more ohmic contacts are formed in the type III-nitride semiconductor portion, the ohmic contacts forming an ohmic connection with the two-dimensional charge carrier gas. A gate structure is configured to control a conductive state of the two-dimensional charge carrier gas. Forming the one or more ohmic contacts comprises forming a structured laser-reflective mask on the upper surface of the type III-nitride semiconductor portion, implanting dopant atoms into the upper surface of the type III-nitride semiconductor portion, and performing a laser thermal anneal that activates the implanted dopant atoms.

13 Claims, 10 Drawing Sheets

(51) Int. Cl.
  *H01L 23/31* (2006.01)
  *H01L 29/10* (2006.01)
  *H01L 29/20* (2006.01)
  *H01L 29/205* (2006.01)
  *H01L 29/417* (2006.01)
  *H01L 29/778* (2006.01)

(52) U.S. Cl.
  CPC ...... *H01L 21/26546* (2013.01); *H01L 23/291* (2013.01); *H01L 23/3171* (2013.01); *H01L 29/1033* (2013.01); *H01L 29/2003* (2013.01); *H01L 29/205* (2013.01); *H01L 29/41725* (2013.01); *H01L 29/7786* (2013.01)

(56) References Cited

OTHER PUBLICATIONS

Tzuo, A-J "Non-thermal alloyed ohmic contact process of GaN-based HEMTs by pulsed laser annealing" Semicond. Sci. Technol. 31 Mar. 15, 2016 pp. 055003 1-8 (Year: 2016).*

Hollauer, C online dissertation publication "2.1 The Material Silicon Dioxide" available online at https://www.iue.tuwien.ac.at/phd/hollauer/node11.html and archived by Wayback Machine on Dec. 6, 2007 at https://web.archive.org/web/20071206115112/https://www.iue.tuwien.ac.at/phd/ hollauer/node11.html (Year: 2007).*

* cited by examiner

SELECTIVE THERMAL ANNEALING METHOD

BACKGROUND

Ion implantation is used to form doped regions in semiconductor devices. According to this technique, impurity atoms are implanted into a semiconductor body by injecting accelerated atoms into the surface of the semiconductor body. After the atoms are implanted, a dopant activation step is performed. The dopant activation step applies heat to the semiconductor body. This thermal energy repairs the crystal damage caused by the atom implantation. Moreover, this thermal energy induces the implanted dopant atoms to move into substitutional lattice sites, thereby producing electrically active donors or acceptors in the semiconductor material. One challenge associated with ion implantation is that the thermal budget required for dopant activation step can damage other components of the semiconductor device.

SUMMARY

According to an embodiment, a method of forming a semiconductor device comprises providing a semiconductor body comprising a base carrier portion and a type III-nitride semiconductor portion disposed on the base carrier portion, the type III-nitride semiconductor portion comprising a heterojunction and two-dimensional charge carrier gas, forming one or more ohmic contacts in the type III-nitride semiconductor portion, the ohmic contacts forming an ohmic connection with the two-dimensional charge carrier gas, and forming a gate structure that is configured to control a conductive state of the two-dimensional charge carrier gas. Forming the one or more ohmic contacts comprises forming a structured laser-reflective mask on the upper surface of the type III-nitride semiconductor portion, implanting dopant atoms into the upper surface of the type III-nitride semiconductor portion, and performing a laser thermal anneal that activates the implanted dopant atoms.

Separately or in combination, forming the structured laser-reflective mask comprises depositing a layer of reflective material on the upper surface of the type III-nitride semiconductor portion and forming first and second openings in the layer of laser reflective material, and wherein the implanting of dopant atoms comprises implanting the dopant atoms through the first and second openings.

Separately or in combination, during the laser thermal anneal, the first and second openings substantially transmit energy from the laser into the semiconductor body and the laser-reflective mask substantially reflects energy from the laser.

Separately or in combination, the method further comprises forming an electrically insulating passivation layer on the upper surface of the type III-nitride semiconductor portion, the structured laser-reflective mask is formed on top of the passivation layer, and performing the laser thermal anneal comprises transmitting energy from the laser through the portions of the passivation layer that are exposed by the first and second openings.

Separately or in combination, the type III-nitride semiconductor portion comprises a channel layer and a barrier layer, the channel layer comprises $In_xGa_{(1-x)}N$, where $x\geq0$, the barrier layer comprises $In_xAl_yGa_zN$, where $x\geq0$, $y>0$ and $z=1-x-y$, and the passivation layer is a layer of silicon nitride.

Separately or in combination, the method further comprises structuring the passivation layer after performing the laser thermal anneal to include first and second openings in the passivation layer, and depositing electrically conductive material in the first and second openings of the passivation layer to form the one or more ohmic contacts, and the first and second openings in the layer of laser reflective material and the first and second openings in the passivation layer are formed by a common photomask.

Separately or in combination, the method further comprises structuring the passivation layer after performing the laser thermal anneal to include first and second openings in the passivation layer, and depositing electrically conductive material in the first and second openings of the passivation layer to form the one or more ohmic contacts, and the first and second openings in the layer of laser reflective material and the first and second openings in the passivation layer are formed by separate photomasks.

Separately or in combination, the laser-reflective mask comprises a plurality of first-type dielectric material layers arranged alternatingly with a plurality of second-type dielectric material layers, and the first-type dielectric material has a different refractive index as the second-type dielectric material.

Separately or in combination, a melting point of the first-type dielectric material and a melting point of the second-type dielectric material are each greater than an activation temperature that activates the implanted dopant atoms.

Separately or in combination, the first-type dielectric material layers and the second-type dielectric material layers is formed by a chemical vapour deposition technique or a physical sputtering technique.

Separately or in combination, the laser thermal anneal is applied with the laser being applied to the laser-reflective mask at an incident angle $\theta$, and wherein each of the first-type dielectric material layers and the second-type dielectric material layers have a thickness of $(\lambda/4\eta)\cdot\sqrt{(1-\sin 2(\theta)/\eta^2)}$, wherein $\lambda$ is a wavelength of the laser, and wherein $\eta$ is a refractive index of the first-type dielectric material or second type dielectric material of the respective layer.

Separately or in combination, material of the laser-reflective mask has an energy bandgap that is higher than the type III-nitride semiconductor material.

Separately or in combination, the laser thermal anneal is performed such that $\lambda<1240/E$, wherein E is an energy bandgap of the type III-nitride semiconductor of the type III-nitride semiconductor portion in electron-volts, and wherein $\lambda$ is a wavelength of the laser in nanometres.

According to another embodiment, a method of forming a semiconductor device comprises providing a semiconductor body, forming a thermosensitive element on or within the semiconductor body, forming a structured laser-reflective mask on the upper surface of the semiconductor body that covers the thermosensitive element and comprises first and second openings, and performing a laser thermal annealing process that transmits laser energy through the first and second openings and into the semiconductor body. The thermosensitive element comprises a critical temperature at which the thermosensitive element is irreparably damaged. The laser thermal annealing process brings portions of the semiconductor body that are underneath the first and second openings above the critical temperature. During the laser thermal annealing process, the thermosensitive element remains below the critical temperature.

Separately or in combination, the thermosensitive element is a gate electrode of a MOSFET device.

Separately or in combination, the thermosensitive element is a gate structure of a HEMT device, and the gate structure comprises a region of doped III-nitride semiconductor material.

Separately or in combination, the method further comprises implanting dopant atoms into the upper surface of the type III-nitride semiconductor portion and performing the laser thermal anneal comprises activating the implanted dopant atoms.

According to an embodiment, a semiconductor device comprises a semiconductor body comprising a base carrier portion and a type III-nitride semiconductor portion disposed on the base carrier portion, the type III-nitride semiconductor portion comprising a heterojunction and two-dimensional charge carrier gas, one or more ohmic contacts that form an ohmic connection with the two-dimensional charge carrier gas, respectively, an electrically insulating passivation layer formed on the base carrier portion directly over the one or more ohmic contacts, and a gate structure that is configured to control a conductive state of the two-dimensional charge carrier gas.

Separately or in combination, the type III-nitride semiconductor portion comprises a channel layer and a barrier layer, the channel layer comprises $In_xGa_{(1-x)}N$, where $x \geq 0$, the barrier layer comprises $In_xAl_yGa_zN$, where $x \geq 0$, $y > 0$ and $z = 1-x-y$, and the passivation layer is a layer of silicon nitride.

Separately or in combination, the one or more contacts comprise conductive metal regions formed on a surface of the type III-nitride semiconductor portion and doped regions implanted in the type III-nitride portion beneath the conductive metal regions, wherein the conductive metal regions directly cover and contact the implanted doped regions.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a selective laser annealing technique are described herein. The technique advantageously allows for laser annealing of selected regions of a semiconductor body while other portions of the semiconductor body remain cool and unaffected by the laser. According to this technique, laser-reflective material is formed on a semiconductor body. The laser-reflective material is structured, e.g., by etching, to include one or more openings that expose selected portions of the semiconductor body. Subsequently, a laser thermal is performed whereby concentrated radiation is directed towards the semiconductor body. The laser-reflective material of the mask reflects most of the energy from the laser source. Meanwhile, the radiation from the laser source is permitted to pass through the openings in the structured laser-reflective mask. The selective laser thermal anneal technique therefore allows for selective application of energy to designated locations of a semiconductor body, with the adjacent regions that are covered by the laser-reflective mask remaining cool. This advantageously allows for laser thermal annealing to be performed with thermosensitive elements (i.e., features that could be damaged from laser thermal annealing) being present on the semiconductor body.

Figure 1:
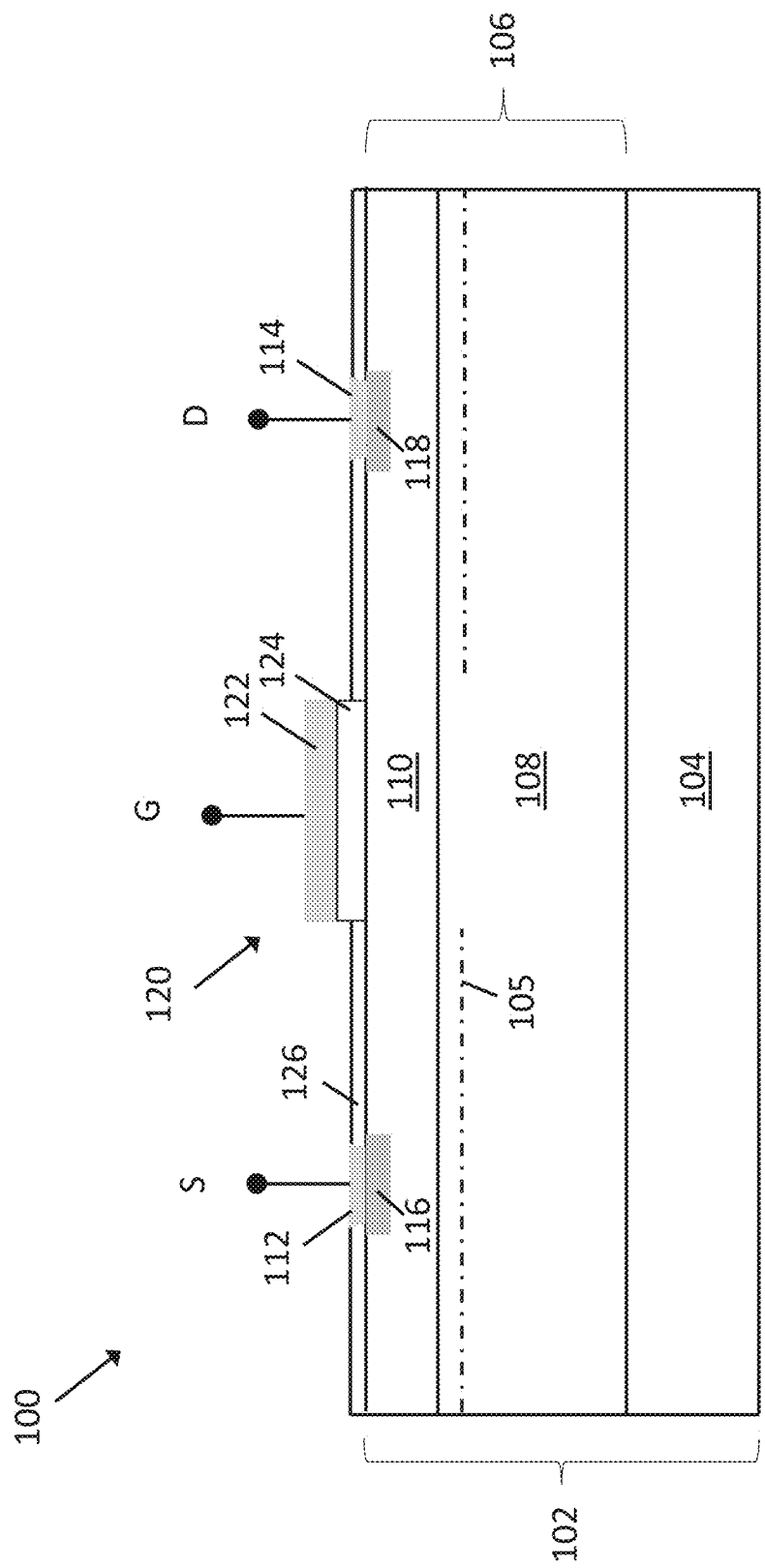
FIG. 1 depicts a high-electron mobility transistor, according to an embodiment.

Referring to FIG. 1, a high-electron mobility transistor 100 is depicted, according to an embodiment. The high-electron mobility transistor 100 is formed in a semiconductor body 102. The semiconductor body 102 includes a base portion 104 and a type III-nitride semiconductor portion 106 disposed on the base portion 104. According to an embodiment, the base portion 104 includes silicon. For example, the base portion 104 can be a commercially available bulk silicon wafer. More generally, the base portion 104 can include any of a wide variety of semiconductor materials, including type IV semiconductor materials, e.g., silicon (Si), sapphire, carbide (SiC), silicon germanium (SiGe), etc.

The type III-nitride semiconductor portion 106 of the semiconductor body 102 includes a channel layer 108 and a barrier layer 110 formed on the channel layer 108. The barrier layer 110 and the channel layer 108 are layers of type III-nitride semiconductor material which have a different bandgap from one another. This difference in bandgap produces a naturally occurring two-dimensional charge carrier gas 105 (i.e., a two-dimensional electron gas (2DEG) or a two-dimensional hole gas (2DHG)) at a heterojunction between the channel layer 108 and the barrier layer 110. Generally speaking, the channel layer 108 and the barrier layer 110 can include any binary, ternary or quaternary III-V semiconductor materials responsible for this device concept. Examples of these III-V semiconductor materials include gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP). According to an embodiment, the channel layer 108 and the barrier layer 110 are GaN based layers. For example, the channel layer 108 can be a layer of gallium nitride and the barrier layer 110 can be layer of aluminum gallium nitride. In another example, the channel layer 108 can be layer of $Al_xGa_{1-x}N$ and the barrier layer 110 can be a layer of $Al_yGa_{1-y}N$ with a higher aluminum concentration as the channel layer 108. In another example, the channel layer can include $In_xGa_{(1-x)}N$, where x≥0, and the barrier layer can at least partially include $In_xAl_yGa_zN$, where x≥0, y>0 and z=1-x-y. In any of the above examples, the type III-nitride semiconductor portion 106 may include a spacer layer of nitride material (e.g., a 1-2 nm thick layer of AlN) between the channel layer 108 and the barrier layer 110.

The semiconductor body 102 may include further layers or regions (not shown) between the base portion 104 and the channel layer 108. For example, the semiconductor body 102 may include a nucleation layer formed on the base portion 104 that facilitates epitaxial growth. This nucleation layer can be a thin layer (e.g., a 100-200 nm layer) of AlN (aluminum nitride), for example. Additionally, or alternatively, the semiconductor body 102 may include additional regions type III-nitride semiconductor material. For example, the semiconductor body 102 may include a lattice transition region that is configured to alleviate mechanical stress due to lattice mismatch. This lattice transition region may include a layered stack of type III-nitride semiconductor layers of different alloy concentration and/or insulating layers.

The transistor 100 includes source and drain contacts 112, 114 on an upper surface of the type III-nitride semiconductor portion 106. The source and drain contacts 112, 114 are ohmic contacts that form an ohmic connection with the two-dimensional charge carrier gas 105. The source and drain contacts 112, 114 may include any of a wide variety of electrical conductors, e.g., nickel, copper, aluminum, titanium, aluminum nitride, titanium nitride, etc., and alloys thereof. The transistor 100 further includes source and drain contact regions 116, 118 in the type III-nitride semiconductor portion 106, which provide the ohmic connection between the conductive material of the source and drain contacts 112, 114 and the two-dimensional charge carrier gas 105. The source contact region 116 is disposed at the interface between the source contact 112 and the type III-nitride semiconductor portion 106. Likewise, the drain contact region 118 is disposed at the interface between the drain contact 114 and the type III-nitride semiconductor portion 106. The source and drain contact regions 112, 114 are doped semiconductor regions that with a higher dopant concentration than the surrounding semiconductor material. For example, the source and drain contact regions 112, 114 may have a dopant concentration on the order of at least $10^{17}$ dopant atoms $cm^{-3}$, whereas the surrounding material of the type III-nitride semiconductor portion 106 may have a dopant concentration of no more than $5 \times 10^{15}$ dopant atoms $cm^{-3}$. The source and drain contact regions 112, 114 lower the energy barrier at the metal-semiconductor interface, thereby facilitating low-contact resistance and substantially ohmic (i.e., non-rectifying) behavior. More generally, the transistor 100 may include any configuration with one or more ohmic contacts which form an ohmic connection with the two-dimensional charge carrier gas 105.

The transistor 100 additionally includes a gate structure 120 on the upper surface of the type III-nitride semiconductor portion 106. In a commonly known manner, the gate structure 120 is configured to control a conductive connection between the source and drain contacts 112, 114. The gate structure 120 includes an electrically conductive gate electrode 122 that receives a gate bias and is configured control the conductive state of the two-dimensional charge carrier gas 105. The gate electrode 122 can include conductive materials such as metals, e.g., nickel, copper, titanium, alloys thereof, metal nitrides, e.g., AlN, TiN, and highly doped semiconductors, e.g., polysilicon. Optionally, the gate structure 120 may include a doped type III-nitride semiconductor region 124 between the gate electrode 122 and the two-dimensional charge carrier gas 105. The material properties of the doped type III-nitride semiconductor region 124 (e.g., doping concentration, thickness, etc.) are tailored such that the doped type III-nitride semiconductor region 124 applies an electric field which depletes the two-dimensional charge carrier gas 105 in the absence of any external bias to the gate structure 120. Thus, the doped type III-nitride semiconductor region 124 can be used to configure the transistor 100 as a normally-off device.

The high-electron mobility transistor 100 additionally includes a passivation layer 126 formed on the upper surface of the type III-nitride semiconductor portion 106. The passivation layer 126 includes an electrically insulating material, such as silicon nitride (SiN), silicon dioxide ($SiO_2$), and silicon oxynitride ($SiO_xN_y$), to name a few. The passivation layer 126 can be a relatively thin (e.g., equal to or less than 100 nm thick, 75 nm thick, 50 nm thick, etc.) layer. Among other things, the passivation layer 126 protects the semiconductor body 102 from harmful environmental conditions, including moisture and particulates.

Referring to FIGS. 2-8, selected process steps for forming the high-electron mobility transistor 100 are depicted. These process steps may be combined with other known techniques to form the high-electron mobility transistor 100 according to any of the embodiments described above.

Figure 2:
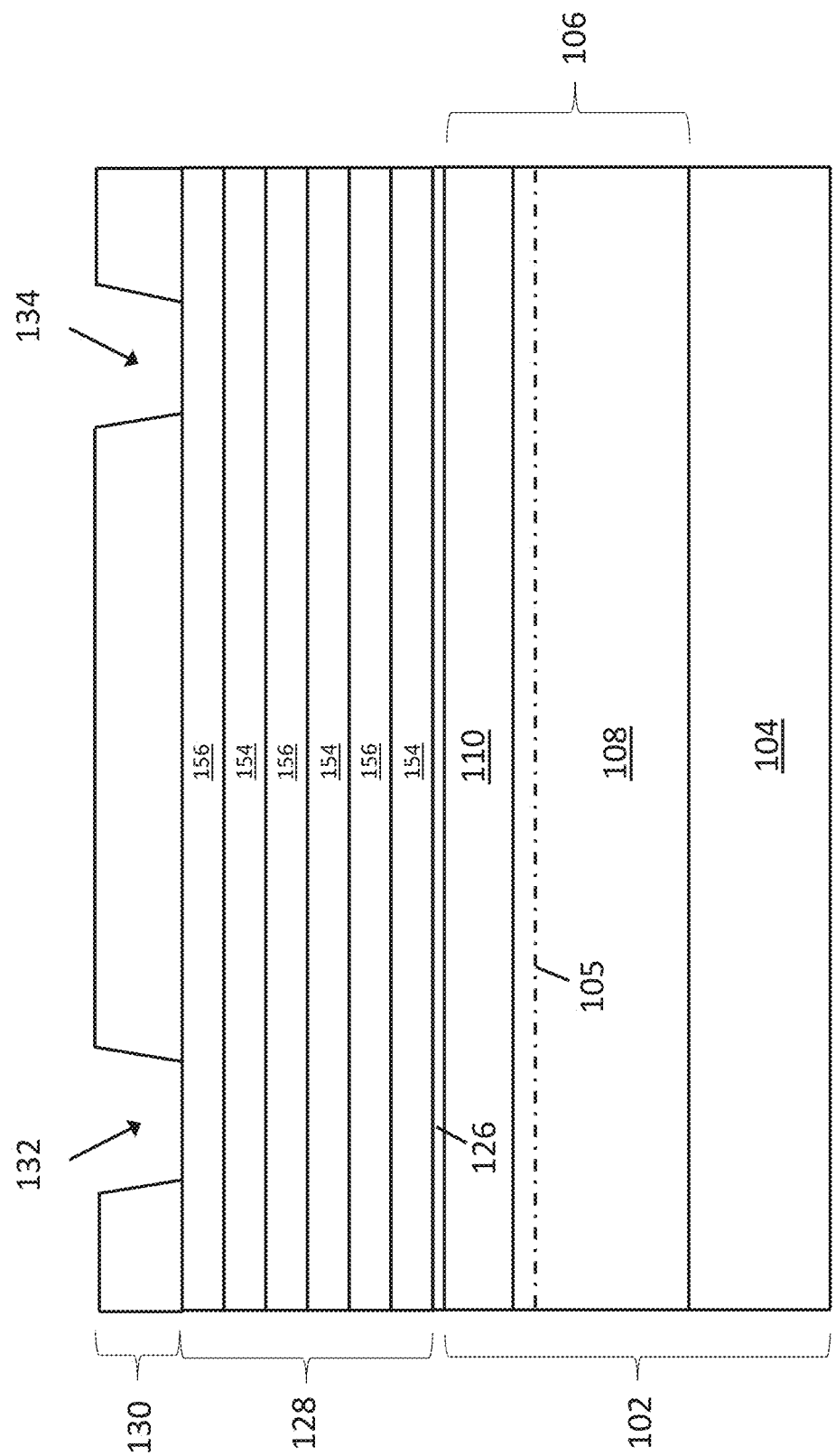
FIG. 2 depicts the formation of laser-reflective material on a semiconductor body, according to an embodiment.

Referring to FIG. 2, a semiconductor body 102 is provided. The semiconductor body 102 can have any of the material configurations previously discussed with reference to FIG. 1. According to one technique, the base portion 104 is provided from a bulk semiconductor wafer, and the various layers of the type III-nitride semiconductor portion 106 including the channel layer 108 and the barrier layer 110 are formed by epitaxial deposition. The passivation layer 126 may be formed by a deposition process, e.g., chemical vapour deposition (CVD).

After providing the semiconductor body 102, laser reflective material 128 is formed on an upper surface of the semiconductor body 102 or on top of the passivation layer 126 (if present). Properties of the laser reflective material 128 and techniques for forming the laser reflective material 128 will be described in further detail below. A first etch resistant mask 130 is formed on top of the laser reflective material 128. The first etch resistant mask 130 can include hardmask materials or photoresist materials. The first etch resistant mask 130 is patterned to include first and second openings 132, 134 that expose portions of the laser reflective material 128. This may be done using lithography techniques, for example.

Figure 3:
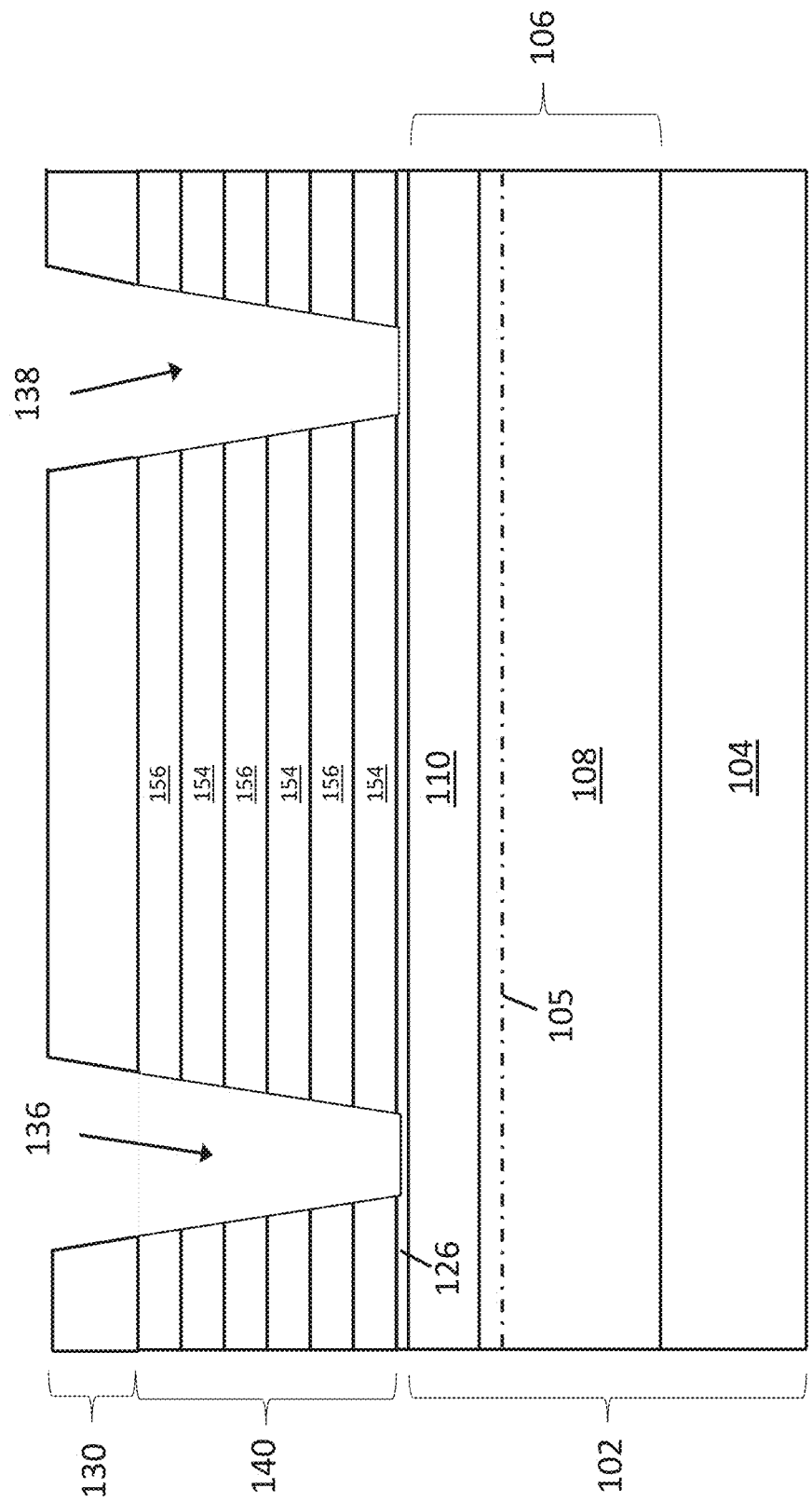
FIG. 3 depicts etching the laser-reflective material to form a structured laser-reflective mask, according to an embodiment.

Referring to FIG. 3, an etching process is performed. The etching process forms first and second openings 136, 138 in the layer of laser reflective material 128, thereby forming a structured laser-reflective mask 140. Generally speaking, this etching process can include any of a wide variety of semiconductor etching techniques such as wet chemical etching, reactive ion etching, plasma etching, etc. According to an embodiment, the etching process is an anisotropic wet chemical etch process, which results in the first and second openings 136, 138 being tapered.

According to an embodiment, the etching process is stopped when the etchant reaches the passivation layer 126. As a result, the passivation layer 126 remains intact and is exposed at the bottom of the first and second openings 136, 138.

Figure 4:
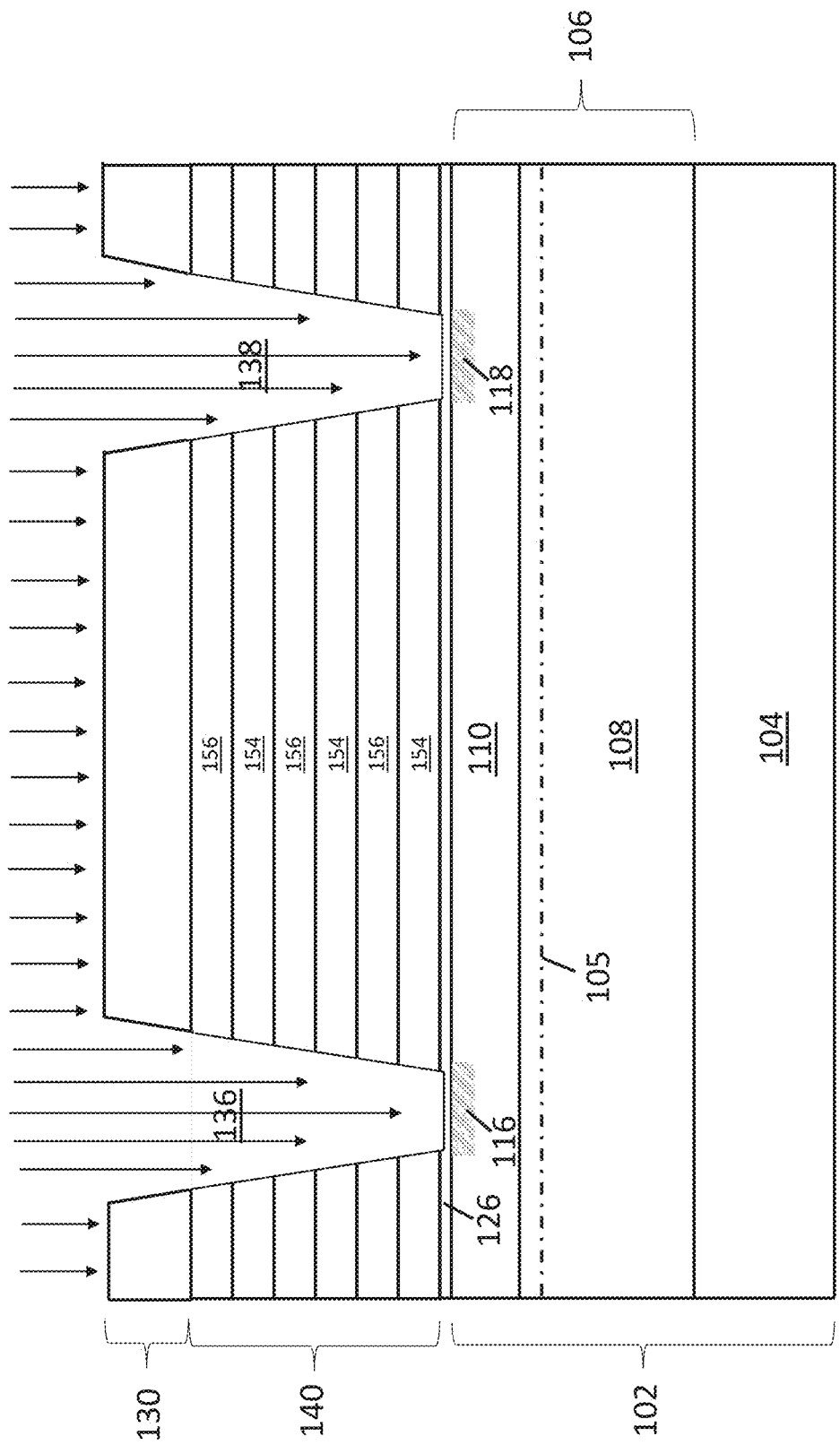
FIG. 4 depicts implanting dopant atoms through the structured laser-reflective mask and into the semiconductor body, according to an embodiment.

Referring to FIG. 4, a dopant implantation process is performed. According to this process, dopant atoms are accelerated towards the upper surface of the semiconductor body 102. The dopant atoms pass through the through the first and second openings 136, 138 in the structured laser-reflective mask 140 and penetrate the passivation layer 126, thereby forming a source contact region 116 and a drain contact region 118 underneath the first and second openings 136, 138. Meanwhile, the structured laser-reflective mask 140 substantially prohibits the dopant atoms from penetrating the semiconductor body 102. That is, the structured laser-reflective mask 140 acts as an ion implantation mask.

Generally speaking, the dopant atoms can include any element that is an impurity with respect to the intrinsic semiconductor material of the semiconductor body 102. These dopant atoms can be used to create p-type or n-type material. In an embodiment, the dopant atoms are silicon atoms, which form n-type dopants in the type-III semiconductor material. A dopant dose of the implanted silicon atoms may in the range of $10^{15}$-$10^{16}$ dopant atoms/cm$^{-2}$, for example.

Figure 5:
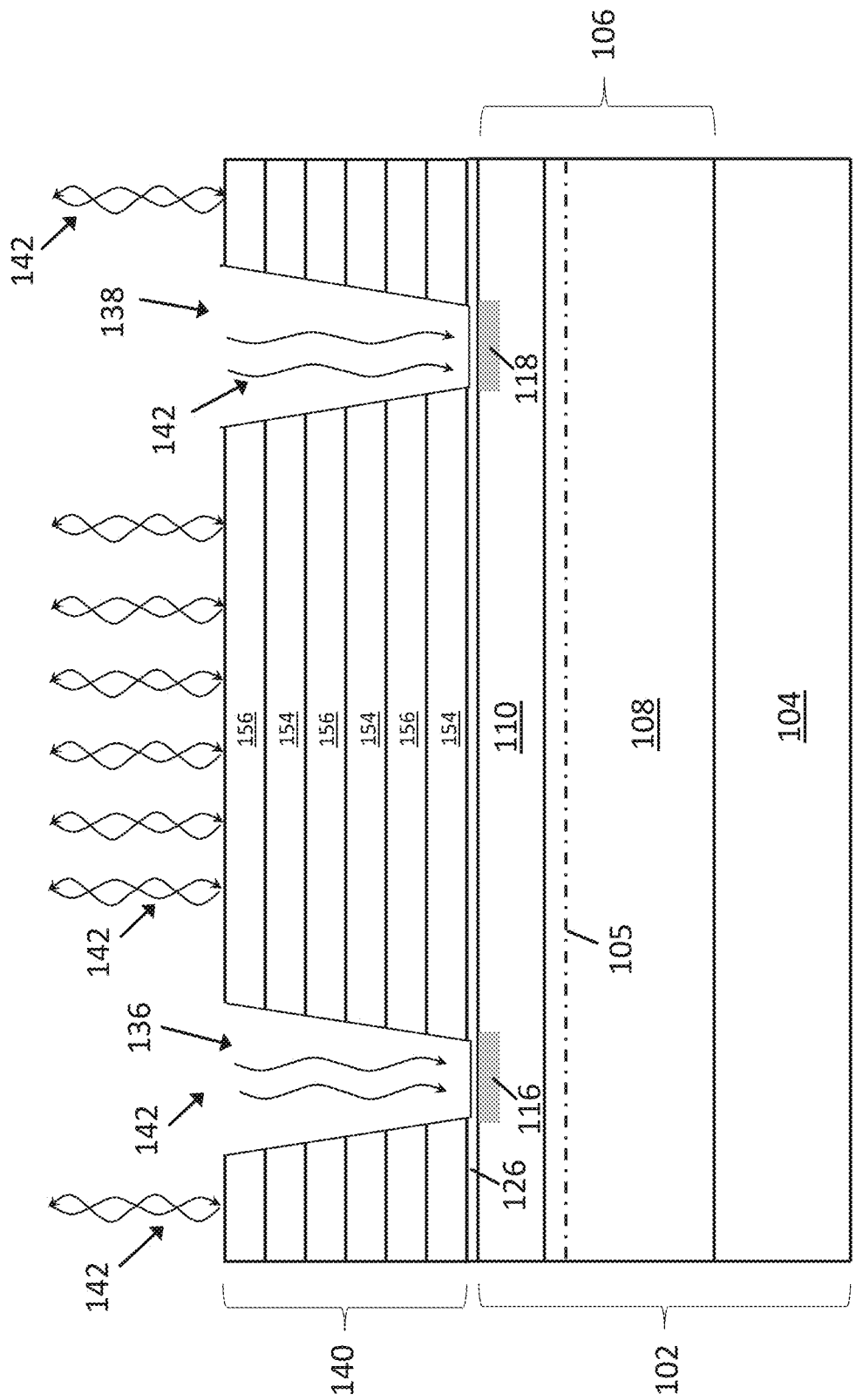
FIG. 5 depicts performing a laser thermal anneal process that transmits laser energy through openings of the structured laser-reflective mask, according to an embodiment.

Referring to FIG. 5, a laser thermal anneal process is performed. Before performing the laser thermal anneal, first etch resistant mask 130 can be removed, e.g., by an etching technique. Subsequently, the laser thermal anneal process is performed by emitting from a laser source highly concentrated electromagnetic radiation 142 directed towards the semiconductor body 102. Generally speaking, the electromagnetic radiation 142 can be in any frequency range, e.g., infrared, visible spectrum, ultraviolet, etc. In an embodiment the laser thermal anneal process involves using an excimer laser as the laser source to apply UV radiation with a wavelength of 308 nm. In another embodiment, the radiation 142 is in the visible light spectrum (i.e., a wavelength of between 400 nm-700 nm). The radiation 142 may be applied in short bursts, e.g., between about 100 ns (nanoseconds) and 200 ns.

During the laser thermal anneal process, energy from the laser source is substantially transmitted through the first and second openings 136, 138 into the semiconductor body 102. This means that at least 50% of the energy from the laser source is transferred into the semiconductor body 102 in the regions directly underneath the first and second openings 136, 138. In various embodiments, a greater amount of energy may be transferred into the semiconductor body 102. For example, at least 60%, 70%, 80%, etc., of the energy from the laser source may be transferred through the first and second openings 136, 138 and into the semiconductor body 102 during the laser thermal anneal process. The electromagnetic radiation 142 is transmitted through the first and second openings 136, 138 and through the portions of the passivation layer 126 that are exposed by the first and second openings 136, 138. The thickness and reflectivity of the passivation layer 126 is such that most of the energy from the laser source passes through the passivation layer 126 and into the semiconductor body 102. The laser thermal anneal process locally elevates the temperature of the source and drain contact regions 112, 114 to a dopant activation temperature, e.g., at least 800° C., at least 900° C., etc. As a result, the source and drain contact regions 112, 114 become electrically active doped regions.

Also during the laser thermal anneal process, energy from the laser source is substantially reflected by the laser-reflective mask 140. This means that greater than 50% of the energy from the laser source is reflected by the laser-reflective mask 140, and hence less than 50% of the energy from the laser source is transmitted to the portions of the semiconductor body 102 that are underneath the laser-reflective mask 140. For example, at least 60%, 70%, 80%, etc., of the energy from the laser source may be reflected by the laser-reflective mask 140 during the laser thermal anneal process. As a result, the portions of the semiconductor body 102 that are covered by the laser-reflective mask 140, i.e., the portions of the semiconductor body 102 outside of the source and drain contact regions 112, 114, are substantially cooler during the laser thermal annealing process. For example, these regions can remain at a temperature of below e.g., at least 300° C., at least 200° C., etc., while the source and drain contact regions 112, 114 are elevated to the dopant activation temperature.

Figure 6:
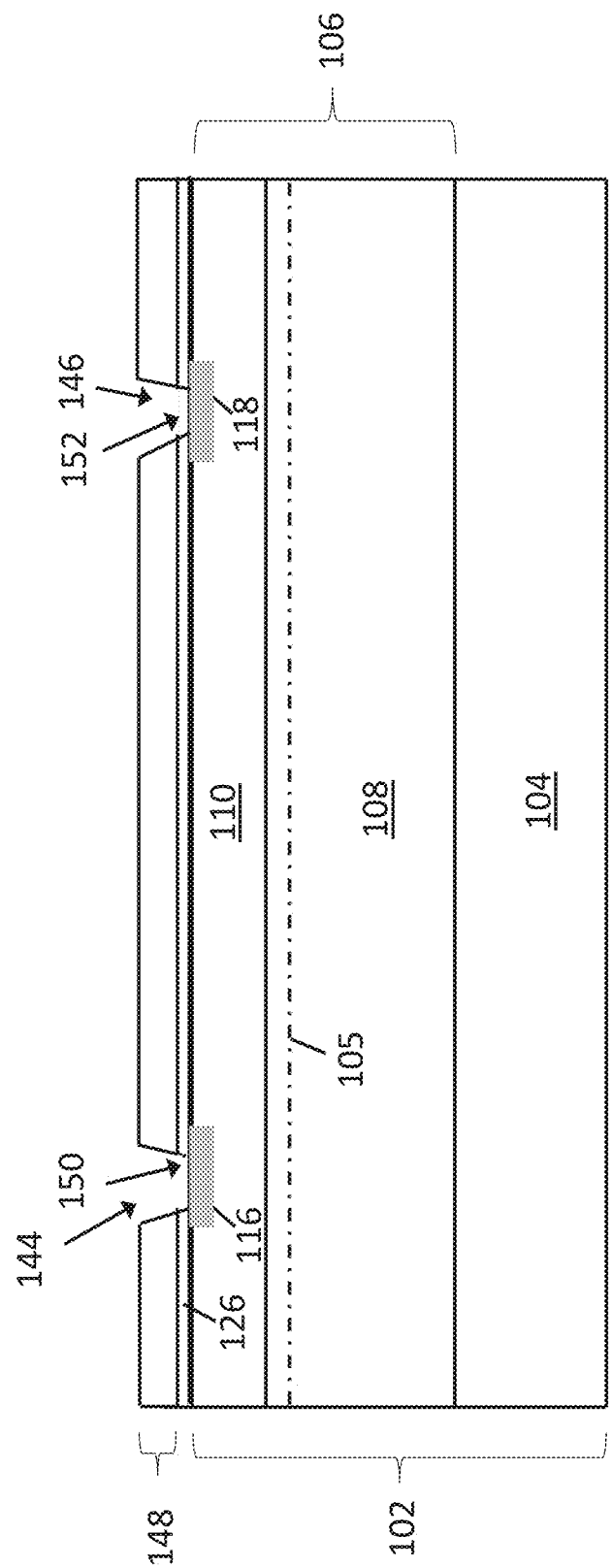
FIG. 6 depicts removing the structured laser-reflective mask forming a second structured mask over passivation layer, according to an embodiment.

Referring to FIG. 6, the structured laser-reflective mask 140 is removed after performing the laser thermal anneal process. This may be done using a wet chemical etchant, such as an aqueous diluted hydrofluoric acid (DHF). Subsequently, a second etch-resistant mask 148 is provided on top of the passivation layer 126. The material of the second etch-resistant mask 148 is configured to permit etching of the passivation layer 126 selective to the mask. Exemplary materials for the passivation layer 126 include hardmask materials and photoresist materials. The second etch-resistant mask 148 is patterned to include first and second openings 144, 146 directly over the source contact region 116 and the drain contact region 118. This may be done using photolithography techniques, for example. Subsequently, the passivation layer 126 is etched to include first and second openings 150, 152 that expose the source and drain contact regions 112, 114 in the type III-nitride semiconductor portion 106.

Figure 7:
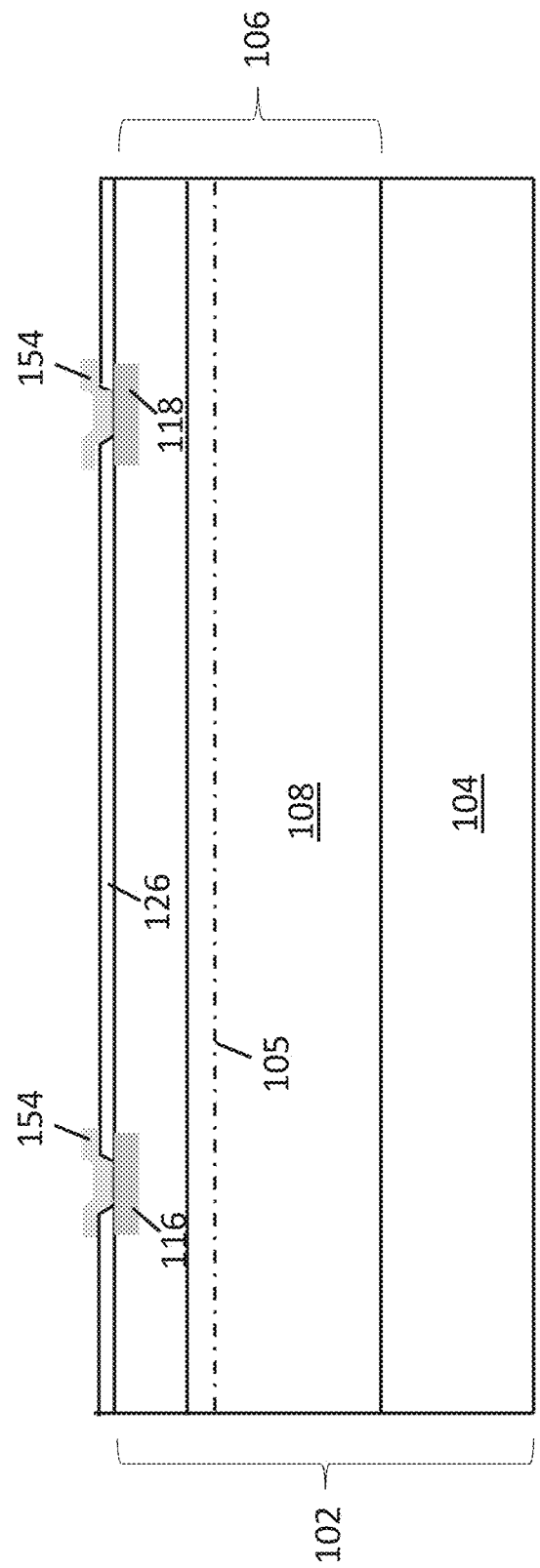
FIG. 7 depicts etching openings in the passivation layer, according to an embodiment.

Referring to FIG. 7, an electrically conductive material 154 is deposited on the semiconductor body 102. This can be done by a blanket deposition process, e.g., physical vapour deposition (PVD). The deposited conductive material 154 fills the first and second openings 150, 152 in the passivation layer 126 and forms an ohmic contact with the source and drain contact regions 112, 114. Generally speaking, the conductive material 154 can include any of a variety of materials such as nickel, copper, titanium, alloys thereof, metal nitrides, e.g., AlN, TiN, etc. In a particular embodiment, the conductive material 154 includes titanium and/or titanium nitride (TiN). After blanket depositing the conductive material 154, it can be structured to remove substantially all of the material that covers the passivation layer 126. This can be done by a selective etching technique, for example.

Figure 8:
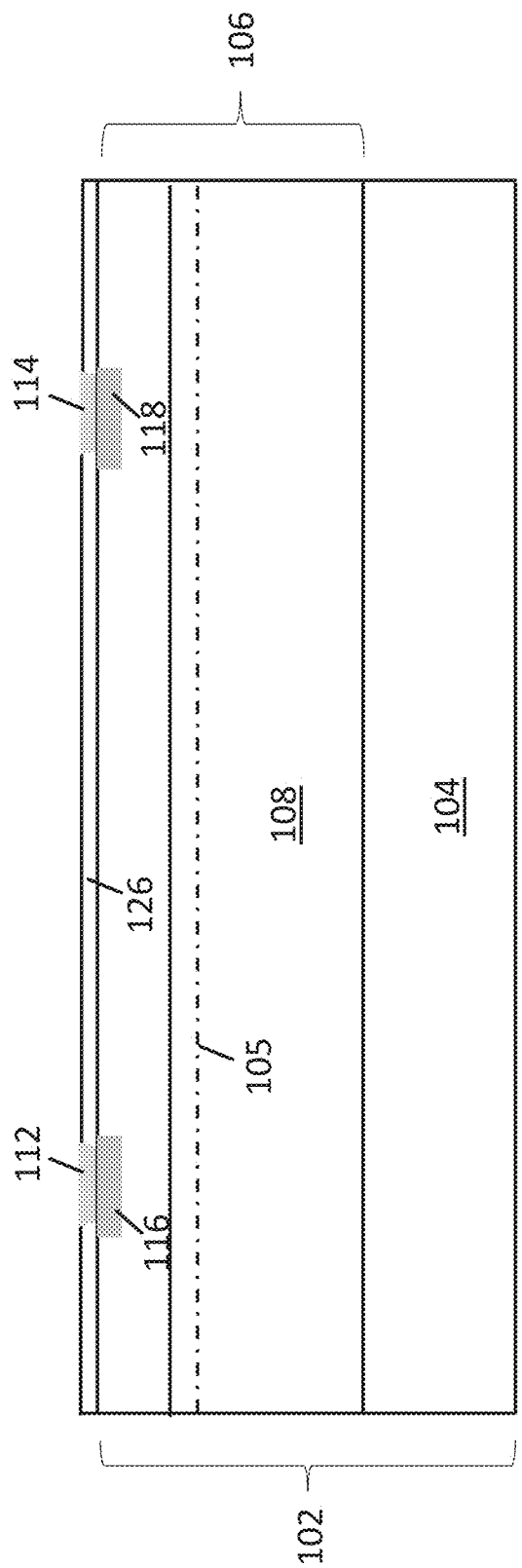
FIG. 8 depicts forming source and drain contacts in the structured passivation layer, according to an embodiment.

Referring to FIG. 8, a planarization process is performed to remove the remaining conductive material 154 that is present on the passivation layer 126. This may be done using planarization techniques such as chemical mechanical polishing (CMP), grinding, etc. As a result, the source and drain contacts 112, 114 have upper surfaces that are substantially planar and coplanar with the upper surface of the passivation layer 126.

One advantage of the above described technique is the ability to form a high-quality passivation layer 126 that is protected from harmful processing temperatures. In type III-nitride semiconductor devices, the interface between the type III-nitride semiconductor material and the passivation layer 126 plays a significant role in the performance of the device. This interface can become damaged during conventional annealing processes that are used for dopant activation. These annealing processes concurrently heat the passivation layer and damage the interface between the type III-nitride semiconductor material and the passivation layer. Because the above described technique covers the passivation layer 126 with the laser reflective material 128 during the annealing step, the passivation layer 126 remains relatively cool during the laser thermal anneal process. Hence, the interface between the passivation layer 126 and the semiconductor body 102 is undamaged. Hence, the technique offers greater flexibility in selecting the size and location of the passivation layer 126, and advantageously allows for the passivation layer 126 to be formed directly over the source and drain contact regions 112, 114 without damage to the interface between the interface between the type III-nitride semiconductor material and the passivation layer 126. The above described technique is particularly advantageous in semiconductor substrates that are hybrids of different lattice constant material, for example a type IV semiconductor base material (e.g., Si) with a type III-nitride semiconductor region (e.g., GaN) formed thereon. In that case, a difference in coefficient of thermal expansion between the hybrid materials results in mechanical stress or strain in the substrate under high temperatures. The laser reflective material 128 maintains the temperature of the substrate below values that cause harmful thermal expansion during the laser thermal anneal process.

In one embodiment of the above described technique, the first and second openings 136, 138 in the laser reflective material 128 and the first and second openings 150, 152 in the passivation layer 126 are formed using a single photomask. Hence, the technique for structuring the passivation layer 126, which determines the geometry of the source and drain contacts 112, 114, is self-aligned with the technique for structuring the laser reflective material 128, which determines the geometry of the source and drain contact regions 112, 114. For example, the first etch resistant mask 130 as described with reference to FIG. 2 is lithographically patterned using a first photomask (not shown), and the second etch-resistant mask 148 as described with reference to FIG. 6 is lithographically patterned using the first photomask again. According to another example of a self-aligned technique, the second etch-resistant mask 148 as shown in FIG. 6 is omitted, and the structured laser-reflective mask 140 is used directly as an etch mask for forming the first and second openings 150, 152 in the passivation layer 126. These self-aligned techniques advantageously mitigate process cost and complexity.

In another embodiment the first and second openings 136, 138 in the laser reflective material 128 and the first and second openings 150, 152 in the passivation layer 126 are formed from separate lithography masks. Hence, the source and drain contacts 112, 114 are not self-aligned with the source and drain contact regions 112, 114. For example, the first etch resistant mask 130 as described with reference to FIG. 2 is lithographically patterned using a first photomask (not shown), and the second etch-resistant mask 148 as described with reference to FIG. 6 is lithographically patterned using a second photomask (not shown). One advantage of this technique is greater flexibility regarding the size and location of the source and drain contacts 112, 114.

Various techniques for forming the laser-reflective mask 140 will now be discussed. In an embodiment, the laser reflective material 128 may include dielectric materials. Specifically, the laser reflective material 128 may have the configuration of a so-called Bragg mirror. In this configuration, the laser reflective material 128 includes multiple dielectric layers with different reflective properties. More generally, the laser reflective material 128 can include any material configuration which substantially reflects ultraviolet radiation, e.g., reflective metals such as copper, gold, silver, etc.

Referring again to FIG. 3, one example of a laser-reflective mask 140 with a Bragg mirror configuration is shown. In this embodiment, the laser reflective material 128 includes a plurality of first-type dielectric material layers 154 type arranged alternatingly with a plurality of second-type dielectric material layers 156. The first-type dielectric material is different from the second-type dielectric material, and has a different refractive index n. In one example, the first-type dielectric material layers 154 are oxide layers (e.g., $SiO_2$) and the second-type dielectric material layers 156 are nitride layers (e.g., $Si_3N_4$). By appropriately tailoring the thickness of the dielectric material layers with respect to a given radiation wavelength, the layered stack can be configured to reflect substantially all of the light directed at the laser-reflective mask 140 in the above described manner. Specifically, the optical depth of each layer can be selected to be at or substantially close to ¼ of the wavelength of the radiation 142 from the laser source. In the depicted embodiment, the laser-reflective mask 140 includes three of the first-type dielectric material layers 154 and three of the second-type dielectric material layers 156. This arrangement advantageously provides substantial reflection (e.g., about 80% of the laser energy in the case of a 308 nm laser anneal). More generally, the number of first-type dielectric material layers 154 and second-type dielectric material layers 156 may be selected based on a variety of factors including desired reflection and processing complexity. Additionally or alternatively, embodiments of a Bragg mirror configuration may include further different dielectric material layers (i.e., third-type dielectric material layers, fourth-type dielectric material layers, etc.) and/or dielectric material layers of different thicknesses.

According to an embodiment, some or all of the first-type dielectric material layers 154 and the second-type dielectric material layers 156 are formed by a chemical vapour deposition technique or a physical sputtering technique. One advantage of these techniques is that they can create dielectric layers reliably at predictable thicknesses. Hence, these techniques allow for precise tailoring of the optical depth of the layers of the laser-reflective mask 140, and consequently highly efficient reflection by the laser-reflective mask 140.

According to an embodiment, a melting point of the dielectric layers from the laser-reflective mask 140 are higher than the temperature that the semiconductor body 102 is heated to during the laser thermal annealing process. For example, the Bragg mirror may include silicon nitride layers with melting point of about 1900° C., silicon dioxide layers with a melting point of about 1700° C., and the laser thermal annealing step may bring the semiconductor body to a temperature of about 800° C.-1000°, e.g., for dopant activation. More generally, the material of the laser-reflective mask 140 can be selected to withstand the process temperatures of the laser thermal annealing to which it is used. If, for example, the laser-reflective mask 140 includes metallic regions (e.g., copper, silver, etc.) this laser-reflective mask 140 can be used in combination with any process that heats the semiconductor body 102 to lower temperatures than the melting point of these metallic regions (e.g., below about 900° C.).

According to an embodiment, the material of the laser-reflective mask 140 has an energy bandgap that is higher than the type III-nitride semiconductor material of the source and drain contact regions 112, 114. This arrangement results in the portion of the semiconductor body 102 that receives energy from the laser (e.g., the source and drain contact regions 112, 114 in the above discussed example) absorbing energy with greater efficiency than within the laser-reflective mask 140. For example, in the above described Bragg mirror configuration, the first-type dielectric material layers 154 and the second-type dielectric material layers 156 of the laser-reflective mask 140 each have a higher bandgap than the subjacent GaN material.

According to an embodiment, the wavelength of the laser thermal anneal is correlated to the energy bandgap of the material being energized. In an example of this concept, the laser thermal anneal is performed such that $\lambda < 1240/E$, wherein E is an energy bandgap of the material being energized by the laser in electron-volts (eV) and $\lambda$ is a wavelength of the radiation 142 from the laser source in nanometers. Maintaining this relationship ensures a high absorption coefficient in the targeted material.

Figure 9:
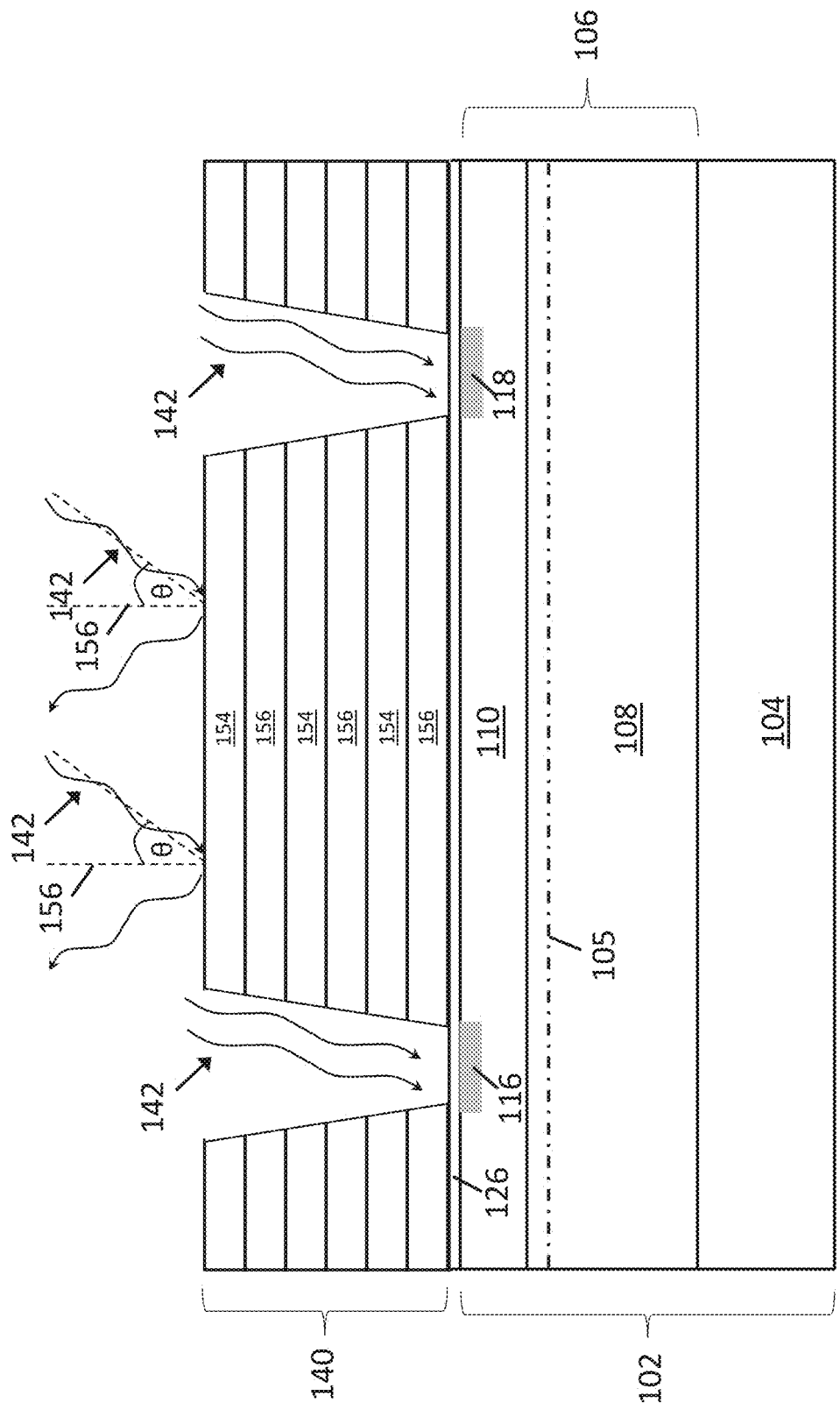
FIG. 9 depicts performing an angled laser thermal anneal process that transmits laser energy through openings of the structured laser-reflective mask, according to an embodiment.

Referring to FIG. 9, a laser thermal anneal process is shown, according to another embodiment. According to this technique, the radiation 142 from the laser source is applied at a non-perpendicular angle relative to the semiconductor body 102. In more detail, the laser being is applied to the laser-reflective mask 140 at an incident angle $\theta$, relative to a plane 156 that is perpendicular to the upper surface of the laser-reflective mask 140. The incident angle $\theta$ is greater than zero degrees and less than 90 degrees. Hence, the laser is applied at an acute angle relative to the upper surface of the laser-reflective mask 140.

According to an embodiment, the properties of the laser-reflective mask 140 are tailored to maximize reflectivity for the angled laser technique. In more detail, each of the layers of the laser-reflective mask 140 (i.e., the first-type dielectric material layers 154 and the second-type dielectric material layers 156) may have a thickness of $(\lambda/4\eta)\cdot\sqrt{(1-\sin 2(\theta)/\eta^2)}$, wherein $\lambda$ is a wavelength of the laser, and wherein $\eta$ is a refractive index of the layer in question. Hence, the first-type dielectric material layers 154 each have a first thickness based on the refractive index $\eta$ of the first-type dielectric material, and the second-type dielectric material layers 156 each have a second thickness based on the refractive index $\eta$ of the second-type dielectric material. By selecting thickness of the layers in the laser-reflective mask 140 to conform to this requirement, the laser-reflective mask 140 is well-suited to reflect substantially all of the laser energy, e.g., at least 80% of the laser energy.

Figure 10:
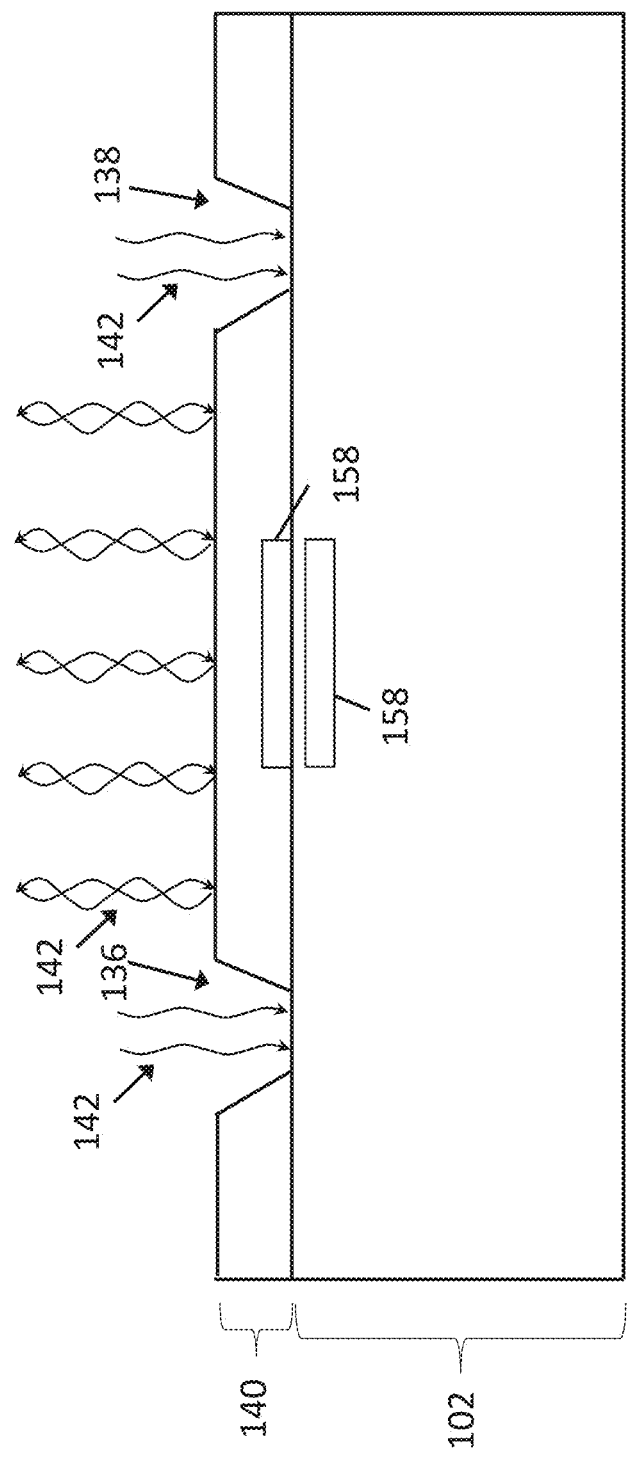
FIG. 10 depicts performing a laser thermal anneal process while a thermosensitive element is protected by a laser-reflective mask, according to an embodiment.

Referring to FIG. 10, a laser thermal anneal process is shown, according to another embodiment. In this embodiment, the laser-reflective mask 140 is used to protect a thermosensitive element 158. According to this technique, a semiconductor body 102 is provided. The semiconductor body 102 may include type III-nitride semiconductor material according to the configuration described with reference to FIG. 1. Alternatively, the semiconductor body 102 may include only type IV semiconductor materials, e.g., silicon (Si) silicon carbide (SiC) or silicon germanium (SiGe). Before the laser thermal anneal process is performed, at least one thermosensitive element 158 is formed on or in the semiconductor body 102. The thermosensitive element 158 has a critical temperature at which the thermosensitive element 158 is irreparably damaged. Generally speaking, the thermosensitive element 158 may any component of an active semiconductor device that is susceptible to damage or malfunction at elevated temperatures, e.g., temperatures associated with semiconductor processing. For example, the thermosensitive element 158 can include the gate structure of a MOSFET device. More specifically, the thermosensitive element 158 can include electrically conductive gate electrode material (e.g., copper, aluminum, polysilicon, etc.) of a MOSFET device. If heated beyond a critical temperature, e.g., the melting point of the gate electrode material, the structure can become irreversibly damaged. In another example, the thermosensitive element 158 can include the gate structure of a HEMT device. This gate structure may include an electrically conductive gate electrode which is susceptible to damage for the reasons explained above. Additionally, this gate structure can include a region of doped III-nitride semiconductor material that is configured to deplete a two-dimensional charge carrier gas, e.g., as described in the gate structure 120 with reference to FIG. 1. This region may include p-type dopants (e.g., magnesium) which tend to diffuse out of the material when the device is subjected to high temperatures, e.g., above 800° C. Still other examples of the thermosensitive element 158 include bipolar transistors, e.g., with a SiGe:C base, capacitors, with ferro-electric dielectrics which are unstable at high temperatures. More generally, the thermosensitive element 158 can be any element that shows deconstruction when exposed to thermal budgets beyond a certain threshold. The thermosensitive element 158 can be formed on the upper surface of the semiconductor body 102 (e.g., in the case of a planar gate structure 120) or within the semiconductor body 102 (e.g., in the case of a trenched gate structure 120).

A laser-reflective mask 140 is formed to cover the thermosensitive element 158. The laser-reflective mask 140 may include any of the materials previously described and may be formed according to any of the techniques previously described. The laser-reflective mask 140 may be formed by initially depositing a blanket layer or layers that completely covers the thermosensitive element 158. For example, in the case that the device structure is a metal gate electrode 122, the laser-reflective mask 140 may be formed by successively depositing the dielectric layers (e.g., by chemical vapor deposition or physical sputtering) directly on the gate electrode 122. Although the upper surface of the laser-reflective mask 140 is planar in the figure, this surface may be undulated due to conformal deposition. Subsequently, the material is structured to include first and second openings 136, 138, e.g., according to the previously described techniques.

After structuring the laser-reflective mask 140, laser thermal annealing may be performed. During this process, radiation 142 is generated by a laser source and transmitted through the first and second openings 136, 138 in the manner previously described. As a result, the exposed regions of the semiconductor body 102 are heated. Meanwhile, the portions of the semiconductor body 102 covered by the laser-reflective mask 140 are substantially prevented from receiving the laser energy. Thus, the regions protected by the laser-reflective mask 140 remain cool. In one example of this concept, the laser thermal annealing process is used in a source/drain dopant activation technique (e.g., as described above, wherein the source and drain regions are locally elevated to a temperature of about 800° C.). Meanwhile, the region that includes the thermosensitive element 158 remains relatively cool, e.g., at or below 300° C. Thus, the thermosensitive element 158 is advantageously prevented from being exposed to damaging temperature.

The term HEMT is also commonly referred to as HFET (heterostructure field effect transistor 100), MODFET (modulation-doped FET) and MESFET (metal semiconductor field effect transistor 100). The terms HEMT, HFET, MESFET and MODFET are used interchangeably herein to refer to any III-nitride based compound semiconductor transistor 100 incorporating a junction between two materials with different band gaps (i.e., a heterojunction) as the channel.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device, the method comprising:
   providing a semiconductor body comprising a base carrier portion and a type III-nitride semiconductor portion disposed on the base carrier portion, the type III-nitride semiconductor portion comprising a heterojunction and two-dimensional charge carrier gas;
   forming one or more ohmic contacts in the type III-nitride semiconductor portion, the ohmic contacts forming an ohmic connection with the two-dimensional charge carrier gas; and
   forming a gate structure that is configured to control a conductive state of the two-dimensional charge carrier gas;
   forming an electrically insulating passivation layer on the upper surface of the type III-nitride semiconductor portion,
   wherein forming the one or more ohmic contacts comprises:
      forming a structured laser-reflective mask on the upper surface of the type III-nitride semiconductor portion;
      implanting dopant atoms into the upper surface of the type III-nitride semiconductor portion; and
      performing a laser thermal anneal that activates the implanted dopant atoms,
   wherein the structured laser-reflective mask is formed on top of the passivation layer, and wherein performing the laser thermal anneal comprises transmitting energy from the laser through the portions of the passivation layer that are exposed by the first and second openings.

2. The method of claim 1, wherein forming the structured laser-reflective mask comprises depositing a layer of reflective material on the upper surface of the type III-nitride semiconductor portion and forming first and second openings in the layer of laser reflective material, and wherein the implanting of dopant atoms comprises implanting the dopant atoms through the first and second openings.

3. The method of claim 2, wherein during the laser thermal anneal, the first and second openings substantially transmit energy from a laser into the semiconductor body and the structured laser-reflective mask substantially reflects energy from the laser.

4. The method of claim 1, wherein the type III-nitride semiconductor portion comprises a channel layer and a barrier layer, wherein the channel layer comprises $In_xGa_{(1-x)}N$, where $x \geq 0$, wherein the barrier layer comprises $In_xAl_yGa_zN$, where $x \geq 0$, $y > 0$ and $z = 1-x-y$, and wherein the passivation layer is a layer of silicon nitride.

5. The method of claim 1, further comprising:
   structuring the passivation layer after performing the laser thermal anneal to include first and second openings in the passivation layer; and
   depositing electrically conductive material in the first and second openings in the passivation layer to form the one or more ohmic contacts, and
   wherein the first and second openings in the layer of laser reflective material and the first and second openings in the passivation layer are formed by a common photomask.

6. The method of claim 1, further comprising:
   structuring the passivation layer after performing the laser thermal anneal to include first and second openings in the passivation layer; and
   depositing electrically conductive material in the first and second openings in the passivation layer to form the one or more ohmic contacts, and
   wherein the first and second openings in the layer of laser reflective material and the first and second openings in the passivation layer are formed by separate photomasks.

7. The method of claim 1, wherein the structured laser-reflective mask comprises a plurality of first-type dielectric material layers arranged alternatingly with a plurality of second-type dielectric material layers, and wherein a first-type dielectric material of the plurality of first type dielectric material layers has a different refractive index as a second-type dielectric material of the plurality of second type dielectric material layers.

8. The method of claim 7, wherein a melting point of the first-type dielectric material and a melting point of the second-type dielectric material are each greater than an activation temperature that activates the implanted dopant atoms.

9. The method of claim 7, wherein at least one of the first-type dielectric material layers and the second-type dielectric material layers is formed by a chemical vapour deposition technique or a physical sputtering technique.

10. The method of claim 7, wherein the laser thermal anneal is applied with a laser being applied to the structured laser-reflective mask at an incident angle $\theta$, and wherein each of the first-type dielectric material layers and the second-type dielectric material layers have a thickness of $(\lambda/4\pi)\cdot\sqrt{(1-\sin 2(\theta)/\eta^2)}$, wherein $\lambda$ is a wavelength of the laser, and wherein $\eta$ is a refractive index of the first-type dielectric material or second type dielectric material of the respective layer.

11. The method of claim 1, wherein the material of the structured laser-reflective mask has an energy bandgap that is higher than the type III-nitride semiconductor portion.

12. The method of claim 1, wherein the laser thermal anneal is performed such that $\lambda < 1240/E$, wherein E is an energy bandgap of a type III-nitride semiconductor of the type III-nitride semiconductor portion in electron-volts, and wherein $\lambda$ is a wavelength of light from the laser thermal anneal in nanometres.

13. A method of forming a semiconductor device, the method comprising:
   providing a semiconductor body comprising a base carrier portion and a type III-nitride semiconductor portion disposed on the base carrier portion, the type III-nitride semiconductor portion comprising a heterojunction and two-dimensional charge carrier gas;

forming one or more ohmic contacts in the type III-nitride semiconductor portion, the ohmic contacts forming an ohmic connection with the two-dimensional charge carrier gas; and forming a gate structure that is configured to control a conductive state of the two-dimensional charge carrier gas;

wherein forming the one or more ohmic contacts comprises:

forming a structured laser-reflective mask on the upper surface of the type III-nitride semiconductor portion;

implanting dopant atoms into the upper surface of the type III-nitride semiconductor portion; and performing a laser thermal anneal that activates the implanted dopant atoms, wherein the structured laser-reflective mask comprises a plurality of first-type dielectric material layers arranged alternatingly with a plurality of second-type dielectric material layers, wherein a first-type dielectric material of the plurality of first type dielectric material layers has a different refractive index as a second-type dielectric material of the plurality of second type dielectric material layers, wherein the laser thermal anneal is applied with a laser being applied to the structured laser-reflective mask at an incident angle $\theta$, wherein each of the first-type dielectric material layers and the second-type dielectric material layers have a thickness of $(\lambda/4\pi)\cdot\sqrt{(1-\sin 2(\theta)/\eta^2)}$, wherein $\lambda$ is a wavelength of the laser, and wherein $\eta$ is a refractive index of the first-type dielectric material or second type dielectric material of the respective layer.

* * * * *

UNITED STATES PATENT AND TRADEMARK OFFICE
CERTIFICATE OF CORRECTION

PATENT NO. : 11,581,418 B2
APPLICATION NO. : 16/894223
DATED : February 14, 2023
INVENTOR(S) : A. Birner et al.

It is certified that error appears in the above-identified patent and that said Letters Patent is hereby corrected as shown below:

In the Claims

Column 16, Line 12 (Claim 13) please change "4π" to -- 4η --

Signed and Sealed this
Twenty-eighth Day of March, 2023

Katherine Kelly Vidal
*Director of the United States Patent and Trademark Office*